United States Patent [19]
Lin et al.

[11] Patent Number: 6,087,064
[45] Date of Patent: Jul. 11, 2000

[54] SILSESQUIOXANE POLYMERS, METHOD OF SYNTHESIS, PHOTORESIST COMPOSITION, AND MULTILAYER LITHOGRAPHIC METHOD

[75] Inventors: Qinghuang Lin, Wappingers Falls; Marie Angelopoulos, Cortlandt; Ahmad D. Katnani, Poughkeepsie, all of N.Y.; Ratnam Sooriyakumaran, San Jose, Calif.

[73] Assignee: International Business Machines Corporation, Armonk, N.Y.

[21] Appl. No.: 09/146,867

[22] Filed: Sep. 3, 1998

[51] Int. Cl.[7] ............................. G03C 1/725; G03F 7/004
[52] U.S. Cl. ...................... 430/270.1; 430/927; 522/172; 523/107; 528/10
[58] Field of Search ................................ 430/270.1, 913, 430/927; 528/10, 29, 23, 37, 42, 25; 522/172; 526/297; 525/326.5; 523/107

[56] References Cited

U.S. PATENT DOCUMENTS

| | | |
|---|---|---|
| 4,657,843 | 4/1987 | Fukuyama et al. . |
| 4,745,169 | 5/1988 | Sugiyama et al. . |
| 4,822,716 | 4/1989 | Onishi et al. . |
| 4,946,921 | 8/1990 | Shirahata et al. . |
| 5,059,512 | 10/1991 | Babich et al. . |
| 5,130,461 | 7/1992 | Shinohara et al. . |
| 5,264,319 | 11/1993 | Sugiyama et al. . |
| 5,286,599 | 2/1994 | Babich et al. . |
| 5,290,899 | 3/1994 | Tanaka et al. . |
| 5,296,332 | 3/1994 | Sachdev et al. . |
| 5,338,818 | 8/1994 | Brunsvold et al. . |
| 5,378,585 | 1/1995 | Wantanabe . |
| 5,378,789 | 1/1995 | Raleigh et al. . |
| 5,385,804 | 1/1995 | Premlatha et al. . |
| 5,399,462 | 3/1995 | Sachdev et al. . |
| 5,422,223 | 6/1995 | Sachdev et al. . |
| 5,484,867 | 1/1996 | Lichtenhan et al. . |
| 5,541,278 | 7/1996 | Raleigh et al. . |
| 5,589,562 | 12/1996 | Lichtenhan et al. . |
| 5,612,170 | 3/1997 | Takemura et al. . |
| 5,731,126 | 3/1998 | Takemura et al. ................... 430/270.1 |
| 5,861,235 | 7/1999 | Harkness et al. ................... 430/270.1 |
| 5,891,529 | 4/1999 | Harkness et al. ................... 430/270.1 |

OTHER PUBLICATIONS

Sugiyama, et al. "Study on Organosilicon Positive Resist. I. Syntheses and Characterization of Silsesquioxane, Siloxane, and Silmethylene Polymers with Phenolic Hydroxy Groups", Journal of Applied Polymer Science, vol. 44, pp. 1573–1582 (1992).

Ban et al. "Synthesis of alkali–soluble silicone resin suitable for resist material in microlithography", Polymer, 1990, vol. 31, Mar, pp. 564–568.

McKean, et al. "A highly etch resistant, negative resist for deep–UV and electron beam lithography", SPIE vol. 1262 Advances in Resist Technology and Processing VII (1990), pp. 110–118.

Parekh "Chemistry of Glycoluril–Formaldehyde Resins And Their Performance in Coatings", Journal of Coatings Technology, vol. 51, No. 658, Nov. 1979, pp. 101–110.

S. Wolf and R.N. Tauber "Silicon Processing for the VLSI Era", vol. 1: Process Technology, pp. 407–458, 1989.

Svoboda et al "Catalysis by Metal Complexes. XL*, Selective Hydrosilylation of Styrene Catalysed by Dl–$\mu$–Carbonyldi–$\pi$–Cyclopentadienyldinickel", Collection Czechoslov. Chem. Commun., vol. 38, 1973, pp. 1783–1785.

*Primary Examiner*—Janet Baxter
*Assistant Examiner*—Yvette M. Clarke
*Attorney, Agent, or Firm*—Schmeiser, Olsen & Watts; Steven Capella

[57] ABSTRACT

Novel silsesquioxane polymers are formed by methods which avoid the use of $BBr_3$. The novel silsesquioxane polymers are especially useful in negative photoresist compositions and photolithographic processes. Alternatively, improved silsesquioxane polymer-containing negative photoresist compositions are obtained by using a polymer component containing a blend of silsesquioxane polymer and non-silsesquioxane polymer. The photoresist compositions provide improved dissolution characteristics enabling the use of 0.26 N TMAH developer. The photoresist compositions also provide improved thermal characteristics enabling use of higher processing temperatures. The photoresist compositions are especially useful in a multilayer photolithographic processes and are capable of producing high resolution.

34 Claims, 3 Drawing Sheets

SILSESQUIOXANE POLYMERS, METHOD OF SYNTHESIS, PHOTORESIST COMPOSITION, AND MULTILAYER LITHOGRAPHIC METHOD

BACKGROUND OF THE INVENTION

1. Technical Field

This invention relates to the field of lithography in semiconductor fabrication. More specifically, the invention relates to a compound with a polysilsesquioxane (PSQ) backbone, a method to synthesize such a PSQ compound, a polymer resin including such a PSQ compound, a photoresist composition incorporating such a polymer resin, and a method for performing multilayer lithography using such a photoresist composition.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced. Adjusting or reformulating photoresist compositions constitutes one attempt to provide high resolution capability (approximately 300 nanometer (nm) resolution or less) and wider process latitude. However, as the desired feature size decreases, the resolution capability of many current resists, even those that are reformulated, is not sufficient to yield the smaller features. The need to achieve less than 300 nm resolution has prompted a push toward increasing numerical aperture (NA) in exposure tools from 0.5 to as high as 0.7 and forming thinner photo resist films on substrates. The higher NA allows for improved resolution of smaller feature sizes, however, the higher NA also reduces the depth of focus of aerial images projected onto the photoresist film. Since the depth of focus is more shallow, the thickness of the photoresist film becomes a factor in properly exposing the photoresist. Thus, thinner photoresist films may be required for proper exposure at high resolution, but often do not yield acceptable overall performance, especially when considering etch requirements for the underlying substrate.

As the photoresist film is thinned to account for the higher NA, the photoresist becomes less suitable as an etch mask against later processing of the underlying semiconductor substrate. For example, since the resist film is thin, variation in thickness becomes more significant than it does in thicker resist films and may introduce defects into subsequent devices formed on the substrate. Also, micro-channels often form in the upper portions of the resist layer during transfer of the resist image to the substrate by etching. When the resist is thin, the micro-channels may extend to the underlying substrate, rendering the photoresist less effective as a mask. Because higher resolution requires higher numerical aperture, and higher numerical aperture in turn requires thinner resists, it is very difficult to develop a total lithography/etch process using current single layer resists.

In addition, the process latitude of many current resists is not sufficient to consistently produce the smaller desired features within specified tolerances. Variations, even though small, are inherent in the lithographic processes that create the resist images used to form devices on semiconductor substrates. Some of the process parameters subject to variation include bake time and temperature, exposure time and source output, aerial image focus, and develop time and temperature. The process latitude of a resist is an indication of how wide such variations can be without resulting in a change in the resolution and/or image profile (i.e., size and/or shape of a resist image). That is, if the process latitude is sufficiently wide, then a process parameter may vary, but the variance will not produce a change in the resist image incompatible with specified tolerances.

One approach that enables the use of higher NA exposure tools as well as a thinner photoresist film is multilayer resist processing. One type of multilayer resist processing uses a bilayer (two layer) imaging scheme by first casting a highly energy absorbing underlayer on the semiconductor substrate then casting a thin, silicon-containing imaging layer (photoresist film) on top of the underlayer. Next, selected portions of the silicon-containing layer are exposed and developed to remove the unexposed portions of a negative photoresist film or the exposed portions of a positive photoresist film. Generally, the underlayer is highly absorbing at the imaging wavelength and is compatible with the imaging layer. Interactions to be considered include adhesion between the two layers, intermixing, and contamination of the imaging layer by the components of the underlayer. Also, the refractive index of the underlayer is matched to the refractive index of the silicon-containing resist layer to avoid degrading the resolution capability of the silicon-containing resist.

Conventional underlayers include diazonapthoquinone (DNQ)/novolak resist material or novolak resin cast on the semiconductor substrate. For the imaging layer, resists containing a wide variety of silicon-containing polymers have been used, including silsesquioxane, silicon-containing acrylics, silanes, etc. Among the several possible silicon-containing polymers, aqueous base-soluble silsesquioxane polymers, such as poly(p-hydroxybenzylsilsesquioxane) (PHBS), have emerged as the most promising candidates for silicon-containing polymers in bilayer resist systems. Unfortunately, although it is promising, PHBS suffers from several short comings.

First, the current methods for synthesis of PHBS and related aqueous base-soluble silsesquioxane polymers involve using $BBr_3$ to demethylate the intermediate poly(p-methoxybenzylsilsesquioxane) (PMBS) that forms when synthesizing PHBS. The use of $BBr_3$ is difficult to control and produces unwanted byproducts, chief among which is HBr, an acidic resist contaminant. Since the HBr contaminates the polymer resin, a separate process must be completed to remove HBr prior to preparation of the desired resist composition. Thus, there is a need to provide a silicon-containing polymer for a multilayer resist composition that is not contaminated with byproducts and that may be synthesized using a more controllable process.

In addition, each of the PHBS-based bilayer resists only produce high resolution (less than or equal to 300 nm) when developed with a relatively weak developer, typically, 0.14 normal (N) tetramethylammoniumhydroxide (TMAH). Unfortunately, the 0.14 N developer is not an industrial standard developer. Accordingly, 0.14 N TMAH often must be purchased specially for the bilayer imaging process at a higher cost than standard developers with the requirement of additional storage and handling facilities. Accordingly, there is a need to provide a silicon-containing bilayer resist system that is compatible with industrial standard developers, including 0.26 N TMAH.

An additional limitation of current silsesquioxane-containing photoresists is that they have a low glass transition temperature. Thus, the current silsesquioxane-containing resists can not be processed at very high temperatures after exposure as may be desired to complete crosslinking reactions in a negative photoresist system in a timely and sufficient manner. This is a further limitation on the ability of current silicon-containing photoresists to generate high resolution patterns in a commercially viable process.

Thus, there is a need for improved silsesquioxane polymers useful in photoresist compositions, improved methods of making silsesquioxane polymers for use in photolithography applications, and improved silsesquioxane polymer-containing photoresist compositions.

SUMMARY OF INVENTION

The invention provides new silsesquioxane polymers useful in photoresist compositions, improved methods of making silsesquioxane polymers which methods avoid the use of bromine-containing compounds, and improved silsesquioxane-containing photoresist compositions which can be processed at higher temperatures.

In one aspect, the invention encompasses novel silsesquioxane polymers, the silsesquioxane polymers as described by the formula:

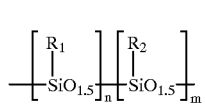

(1)

wherein the $R_1$ groups contain a component comprising an aromatic group bonded to a $C_2$ (or higher) alkyl where the alkyl is also bonded directly to an Si atom of the silsesquioxane structure. The number n is greater than zero, and n and m are preferably selected such that n/(n+m) equals 0.05 to 1.0, and the silsesquioxane polymer preferably has a weight average molecular weight of about 800 to 500,000. $R_1$, $R_2$, n, and m are selected such that the silsesquioxane polymer is adapted for use in a photoresist composition, more preferably in negative photoresist compositions which are aqueous base soluble prior to radiation exposure.

The invention also encompasses photoresist compositions and photoresist structures containing the above mentioned silsesquioxane polymers as well as methods of forming such photoresist structures and using such photoresist structures to transfer patterns to underlying substrates.

In another aspect, the invention encompasses a method of synthesizing silsesquioxane polymers that includes forming a functionalized phenylalkyl silicon-containing compound, polymerizing the resulting functionalized phenylalkyl compound to form a silsesquioxane polymer, and preferably hydrolyzing the resulting polymer to produce a silsesquioxane polymer suitable for use in negative photoresist compositions.

The invention also encompasses photoresist compositions and photoresist structures containing silsesquioxane polymers produced by the above method as well as methods of forming such photoresist structures and using such photoresist structures to transfer patterns to underlying substrates.

In another aspect, the invention encompasses silsesquioxane polymer-containing negative photoresist compositions having increased glass transition temperatures. The improved photoresist compositions contain a blend of silsesquioxane polymer and a non-silsesquioxane polymer, more preferably a non-silsesquioxane polymer which is substantially free of silicon in its backbone structure such as poly(hydroxystyrene) and poly(cyclo-olefm). The non-silsesquioxane polymer is preferably selected such that the photoresist composition containing it can be developed after patternwise radiation exposure using 0.14 normal (N) or greater (more preferably about 0.26 N) tetramethylammonium hydroxide (TMAH) developer.

The invention also encompasses and photoresist structures containing the silsesquioxane polymer-containing negative photoresist compositions having increased glass transition temperature of the invention, as well as methods of forming such photoresist structures and using such photoresist structures to transfer patterns to underlying substrates. The photoresist compositions are especially useful in multi-layer photolithographic processes, especially processes involving use of 0.26 N aqueous alkaline developers.

The invention further encompasses polymer blend compositions containing a combination of silsesquioxane polymer and non-silsesquioxane polymer described above.

The foregoing and other features and advantages of the invention will be apparent from the following detailed description of the invention and accompanying drawings.

BRIEF DESCRIPTION OF DRAWINGS

Preferred embodiments of the present invention will hereinafter be described in conjunction with the appended drawings, where like designations denote like elements.

DETAILED DESCRIPTION OF THE INVENTION

Figure 1:
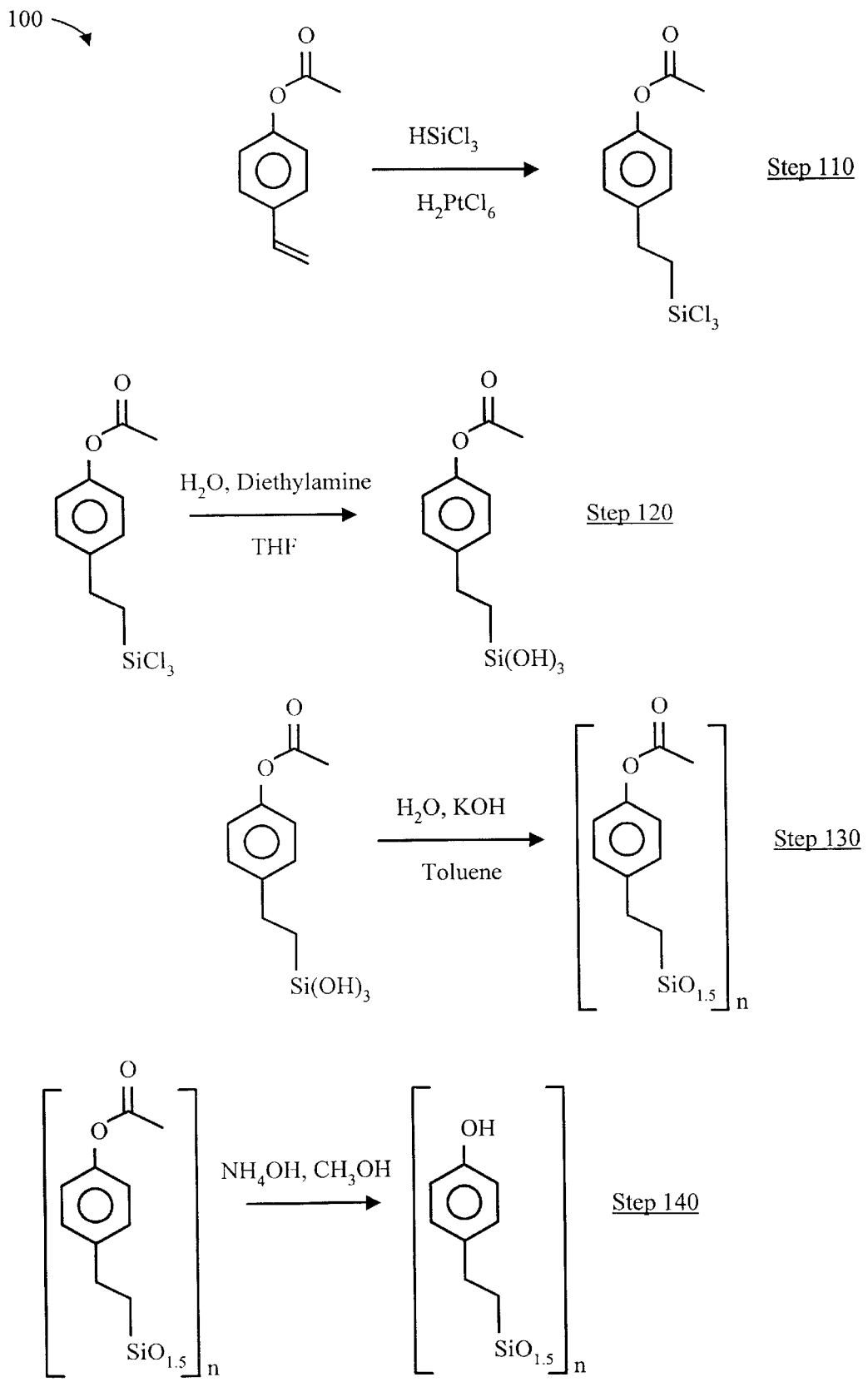
FIG. 1 is diagram showing a method for synthesizing silicon-containing compounds according to a preferred embodiment of the present invention, in particular, poly(p-hydroxyphenylethylsilsesquioxane)

The invention provides new silsesquioxane polymers useful in photoresist compositions, improved methods of making silsesquioxane polymers which methods avoid the use of bromine-containing compounds, and improved silsesquioxane-containing photoresist compositions which can be processed at higher temperatures. The invention also encompasses photoresist compositions and photoresist structures containing silsesquioxane polymers mentioned above as well as methods of forming photoresist structures and using such photoresist structures to transfer patterns to underlying substrates.

The novel silsesquioxane polymers of the invention can be described by the formula:

(1)

wherein the $R_1$ groups contain a component comprising an aromatic group bonded to a $C_2$ (or higher) alkyl, more preferably ethyl or branched $C_2$ alkyl (e.g. α-methylbenzyl), where the alkyl is also bonded directly to an Si atom of the silsesquioxane structure. The aromatic group of $R_1$ is preferably phenyl group having an additional moiety bonded thereto (i.e. in addition to the above-mentioned alkyl). The $R_1$ additional moiety is preferably a hydroxyl group, preferably in a para position on the aromatic ring.

Thus, $R_1$ preferably has a structure:

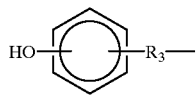
(2)

wherein $R_3$ is preferably alkyl, which includes branched alkyl, having the formula $C_aH_{2a}$ wherein a is preferably at least 2. If desired, the aromatic ring of $R_1$ shown as structure (2) may be additionally substituted, provided the substitution does not prevent the silsesquioxane polymer from being adapted for its intended use. Any such substitution preferably does not cause the silsesquioxane polymer to have a glass transition temperature ($T_g$) below the $T_g$ of poly(p-hydroxyphenylethylsilsesquioxane) (PHPES). For example, $R_1$ may include multiple hydroxyl moieties instead of just one. It should be understood that the novel silsesquioxane polymers of the invention may contain a plurality of different $R_1$ structures within the above description of $R_1$ on the same polymer.

The novel silsesquioxane polymers of the invention are not limited to any specific $R_2$ structure. $R_2$ is preferably independently selected from among alkyl, cycloalkyl, and aryl moieties, which include polycyclic alkyls and aryls. More preferably, each occurrence of $R_2$ is independently selected from among moieties having structures (3) to (6) below:

(3)

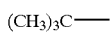
(4)

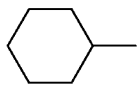
(5)

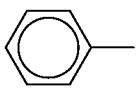
(6)

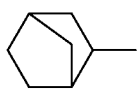
(7)

wherein $R_4$ is preferably $C_dH_{2d}$, d is preferably at least 1, $R_7$ is preferably $C_eH_{2e}$, $R_g$—CO—, or $R_8$—O—CO—, e is preferably at least 1, $R_8$ is preferably $C_gH_{2g+1}$—, and g is preferably at least 1. In other words, each occurrence of $R_2$ is preferably independently selected from among alkoxyphenylalkyl having at least 1 carbon atom each in its alkyl moiety and alkoxy moiety, alkyl acid alkylphenyl ester or alkoxy methanoic acid alkylphenyl ester having at least 1 carbon atom in each alkyl moiety, t-butyl, cyclohexyl, phenyl, and bicycloheptyl. If desired, the aromatic rings of structures (3), (5), and (6) may be further substituted as indicated above for structure (2). Also, it should be noted that the alkyl moieties described for $R_4$, $R_7$, and $R_8$ may include branched alkyls. It should be understood that the novel silsesquioxane polymers of the invention may contain a plurality of different $R_2$ structures within the above description of $R_2$ on the same polymer.

The number n is greater than zero, and the numbers n and m are preferably selected such that n/(n+m) equals 0.05 to 1.0, more preferably 0.4 to 1.0. The novel silsesquioxane polymers of the invention preferably have a weight average molecular weight of about 800 to 500,000, more preferably 1,500 to 100,000, most 1,500 to 10,000. Preferably, the $R_1$ and $R_2$ structures and their proportions as well as the polymer molecular weight are selected to provide a suitable silsesquioxane polymer for use in photolithographic applications. The properties of interest in this regard include solubility in aqueous alkaline solvents and thermal processing temperature as indicated by the glass transition temperature ($T_g$) of the polymer. $T_g$ is preferably between 30 and 400° C., more preferably between 60 and 300° C., and most preferably between 90 and 250° C. These properties are discussed further below in the discussion of photoresist compositions.

Examples of the novel silsesquioxane polymers of the invention include: poly(p-hydroxyphenylethylsilsesquioxane) (PHPES), poly(p-hydroxyphenylethylsilsesquioxane-co-p-hydroxy-α-methylbenzylsilsesquioxane) (PHPE/HMBS), poly(p-hydroxyphenylethylsilsesquioxane-co-methoxybenzylsilsesquioxane) (PHPE/MBS), poly(p-hydroxyphenylethylsilsesquioxane-co-t-butylsilsesquioxane) (PHPE/BS), poly(p-hydroxyphenylethylsilsesquioxane-co-cyclohexylsilsesquioxane) (PHPE/CHS), poly(p-hydroxyphenylethylsilsesquioxane-co-phenylsilsesquioxane) (PHPE/PS), poly(p-hydroxyphenylethylsilsesquioxane-co-bicycloheptylsilsesquioxane) (PHPE/BHS), polyp-hydroxy-α-methylbenzylsilsesquioxane) (PHMBS), polyp-hydroxy-α-methylbenzylsilsesquioxane-co-p-hydroxybenzylsilsesquioxane) (PHMB/HBS), poly(p-hydroxy-α-methylbenzylsilsesquioxane-co-methoxybenzylsilsesquioxane) (PHMB/MBS), poly(p-hydroxy-α-methylbenzylsilsesquioxane-co-t-butylsilsesquioxane) (PHMB/BS), poly(p-hydroxy-α-methylbenzylsilsesquioxane-co-cyclohexylsilsesquioxane) (PHMB/CHS), poly(p-hydroxy-α-methylbenzylsilsesquioxane-co-phenylsilsesquioxane) (PHMB/PS), poly(p-hydroxy-α-methylbenzylsilsesquioxane-co-bicycloheptylsilsesquioxane) (PHMB/BHS), and poly(p-hydroxybenzylsilsesquioxane-co-p-hydroxyphenylethylsilsesquioxane) (PHB/HPES).

Referring now to FIG. 1, the present invention also includes a method 100 for synthesizing silsesquioxane polymers which preferably avoids the use of $BBr_3$ in converting a protected hydroxyl moiety to a hydroxyl moiety. Instead, a hydrolysis reaction or other reaction performs the conversion, thus avoiding contamination of the polymer resin with HBr and providing a more controllable synthesis. The synthesis method of the invention is preferably started using a phenyl compound including a protected hydroxyl moiety and an alkenyl moiety, the alkenyl moiety is then hydrosilylated with a Ni or Pt catalyst, the resulting silicon-containing compound is then polymerized to form a silsesquioxane polymer. Preferably, the method further includes hydrolyzing the protected hydroxyl moiety on the silsesquioxane polymer.

Specifically, according to FIG. 1, the preferred method begins with forming a functionalized phenylalkyl compound that possesses a protected hydroxyl moiety and a trihydroxysilane containing moiety on the alkyl moiety. Preferably, the alkyl moiety, which includes branched alkyls, has at least 1 carbon atom, and more preferably 2 carbon atoms. Also, preferably the protected hydroxyl moiety is selected from among $R_5$—COO—, $R_6$—O—, $R_6$—O—COO—, and other protected moieties that may be selectively converted to form hydroxyphenylalkyl, wherein $R_5$ is selected from among H, alkyl, aryl, and combinations thereof and $R_6$ is selected from alky, aryl, silyl, and combinations thereof. In other words, the protected hydroxyl moiety may be a compound bound by an ester linkage, ether linkage, or carbonyl linkage to the phenylalkyl compound. The protected hydroxyl moiety is more preferably bound by an ester linkage, since it can be converted to a hydroxyl moiety by hydrolysis, however, an ether linkage may also be converted with somewhat more difficulty by dealkylation. Other protected hydroxyl moieties are also conceivable that can be selectively converted to form hydroxyphenylalkyl.

Steps 110 and 120 of method 100 show a more preferred embodiment of reaction steps that provide a functionalized phenylalkyl compound. In step 110 acetoxystyrene, or other protected hydroxystyrene, undergoes hydrosilylation with platinum or, alternatively, nickel catalyst to add a trihalosilane to the ethenyl moiety of the styrene moiety, converting the ethenyl moiety to an ethyl moiety. A few examples of hydrosilylation catalysts include hydrogen hexachloroplatinate(IV), di-$\mu$-carbonyl-di-$\pi$-cyclopentadienyldinickel, a platinum-carbonyl complex, a platinum-divinyltetramethyldisiloxane complex, and a platinum-cyclovinylmethylsiloxane complex. In step 110, $HSiCl_3$ is preferably added to acetoxystyrene. Next, in step 120, the product of step 110 is further reacted to convert the —$SiCl_3$ to —$Si(OH)_3$. Thus, the protected hydroxyl moiety comprises the acetoxy moiety, the alkyl moiety comprises the ethyl moiety, and the trihydroxysilane containing moiety comprises the —$Si(OH)_3$. Step 130 of method 100 polymerizes the product of step 120 to a polysilsesquioxane (PSQ) backbone having p-acetoxyphenylethyl bound thereto. In step 140, the product of step 130 is hydrolyzed with a base catalyst to produce a PHPES homopolymer.

Alternatively, if another functionalized phenylalkyl compound was formed in steps 110 and 120, then different groups may be bound to the PSQ backbone. For example, different protected hydroxyl moieties could be provided, the phenyl could be additionally substituted, perhaps with multiple protected hydroxyl moieties, the alkyl moiety could have more or fewer carbon atoms, and the trihydroxysilane could be different. Further, one or more additional functionalized phenylalkyl compounds or other functionalized compounds could be provided in the polymerization step to produce copolymers, terpolymers, or multifunctional polymers. That is, each of the homopolymers and copolymers mentioned above may be synthesized by a method analogous to method 100. Accordingly, various functionalized phenylalkyl compounds and silicon-containing compounds, in addition to those described above, may be synthesized by method 100 simply by combining alternate monomers.

The invention further encompasses novel and improved negative photoresist compositions. The photoresist compositions of the invention generally comprise a polymer component including a silsesquioxane polymer, an acid-sensitive crosslinking component, and photosensitive acid generator. The polymer component may be one of the novel silsesquioxane polymers described above. More preferably, the polymer component preferably is a blend of a silsesquioxane polymer with a non-silsesquioxane polymer, most preferably a non-silsesquioxane polymer which is substantially free of silicon in its backbone structure. The photoresist compositions of the invention are preferably characterized by improved alkaline solubility characteristics and improved thermal properties, enabling higher processing temperatures and improved lithographic performance.

$T_g$ is a general indicator of the temperature above which the polymer may start to flow. For photoresist applications, if $T_g$ of the polymer component is too low, then the ability to use the photoresist in processes involving higher temperatures will be limited. Higher temperature processing is often desired in the context of post-exposure baking (e.g. to facilitate crosslinking in the negative resist) and/or in the context of reactive ion etching (RIE) or other steps used to transfer the pattern from the patterned photoresist layer to the underlying layer(s). In such circumstances, exposure of the low $T_g$ photoresist to excessive temperature may cause the imaging layer to deform or reflow, deteriorating the image formed in the imaging layer. Alternatively, low $T_g$ polymer components may not be usable without elaborate techniques (e.g. long time, low temperature bake or long time, less aggressive RIE) or exotic materials. For these reasons, higher $T_g$ polymer component is generally desirable.

Where the photoresist composition polymer component contains only one or more of the above-described novel silsesquioxane polymers, preferably the silsesquioxane polymer is selected to have a relatively high a glass transition temperature. Preferably, the glass transition temperature is greater than or equal to the glass transition temperature of PHPES described above.

More preferably, the negative photoresist compositions of the invention contain a polymer component which is a blend of a silsesquioxane polymer with a non-silsesquioxane polymer, most preferably a non-silsesquioxane polymer which is substantially free of silicon in its backbone structure. Preferably, the non-silsesquioxane polymer is selected to provide a photoresist polymer component having a higher $T_g$ than the silsesquioxane polymer alone.

In the photoresist compositions containing the blended polymer component, the silsesquioxane polymer in the blend may be selected from the novel silsesquioxane polymers described above or may be selected from other silsesquioxane polymers such as poly(p-hydroxybenzylsilsesquioxane) (PHBS), poly(p-hydroxybenzylsilsesquioxane-co-methoxybenzylsilsesquioxane) (PHB/MBS), poly(p-hydroxybenzylsilsesquioxane-co-t-butylsilsesquioxane) (PHB/BS), poly(p-hydroxybenzylsilsesquioxane-co-cyclohexylsilsesquioxane) (PHB/CHS), poly(p-hydroxybenzylsilsesquioxane-co-phenylsilsesquioxane) (PHB/PS), and poly(p-hydroxybenzylsilsesquioxane-co-bicycloheptylsilsesquioxane) (PHB/BHS). If desired, a combination of different silsesquioxane polymers may be used in the blend with the non-silsesquioxane polymer.

The non-silsesquioxane polymer is preferably substantially miscible with the silsesquioxane polymer. Preferably, the non-silsesquioxane polymer is selected from the group consisting of polyhydroxystyrene (PHS), poly(cyclo-olefins), or other polymers containing hydroxystyrene and/ or cyclo-olefin monomers. More preferably, the non-silsesquioxane polymer is selected from among polymers having the chemical formula:

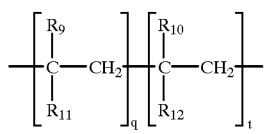

(7)

wherein each occurrence of $R_9$ or $R_{10}$ is preferably independently selected from among H, $CH_3$, $C_2$ or higher alkyl, or halogen. Each occurrence of $R_{11}$ is preferably independently selected from hydroxyphenyl or cycloalkyl with a cross-linkable functionality. Each occurrence of $R_{12}$ is preferably independently selected from among phenyl, hydroxyphenyl, cycloalkyl, hydroxycyclohexyl, and —COO—$R_{13}$—OH, wherein $R_{13}$ may be alkyl, cycloalkyl, or aryl and $R_{10}$ may not be halogen when $R_{12}$ is —COO—$R_{13}$—OH.

As indicated above by the moieties listed for $R_9$ and $R_{10}$, the vinyl moiety of each monomer may also include a methyl or halogen moiety. The numbers q and t are preferably selected such that q/(q+t) equals 0.4 to 1.0. $R_9$, $R_{10}$, $R_{11}$, $R_{12}$, q, and t are preferably selected such that the non-silsesquioxane polymer is base soluble and substantially miscible in a blend with the silsesquioxane polymer. Preferably, any hydroxyl moieties in $R_{11}$ or $R_{12}$ are in a para-position; thus, 4-hydroxyphenyl is more preferred for $R_{11}$. If desired, any aromatic rings of $R_{11}$ or $R_{12}$ shown in structure (7) may be additionally substituted, provided the substitution does not prevent the non-silicon-containing compound from being base soluble or substantially miscible in the polymer blend. For example, the $R_{11}$ hydroxyphenyl may include multiple hydroxyl moieties instead of just one. Most preferably, the non-silsesquioxane polymer is selected from among the following polymers: poly(4-hydroxystyrene), poly(4-hydroxystyrene-co-styrene), poly(4-hydroxystyrene-co-4-vinylcyclohexanol), poly(4-hydroxystyrene-co-acrylic acid hydroxymethyl ester), and poly(4-hydroxystyrene-co-acrylic acid hydroxyethyl ester). The weight average molecular weight of the non-silsesquioxane polymer is preferably is about 1,000 to 100,000, more preferably about 2,000 to 50,000, most preferably about 3,000 to 25,000.

Figure 2:
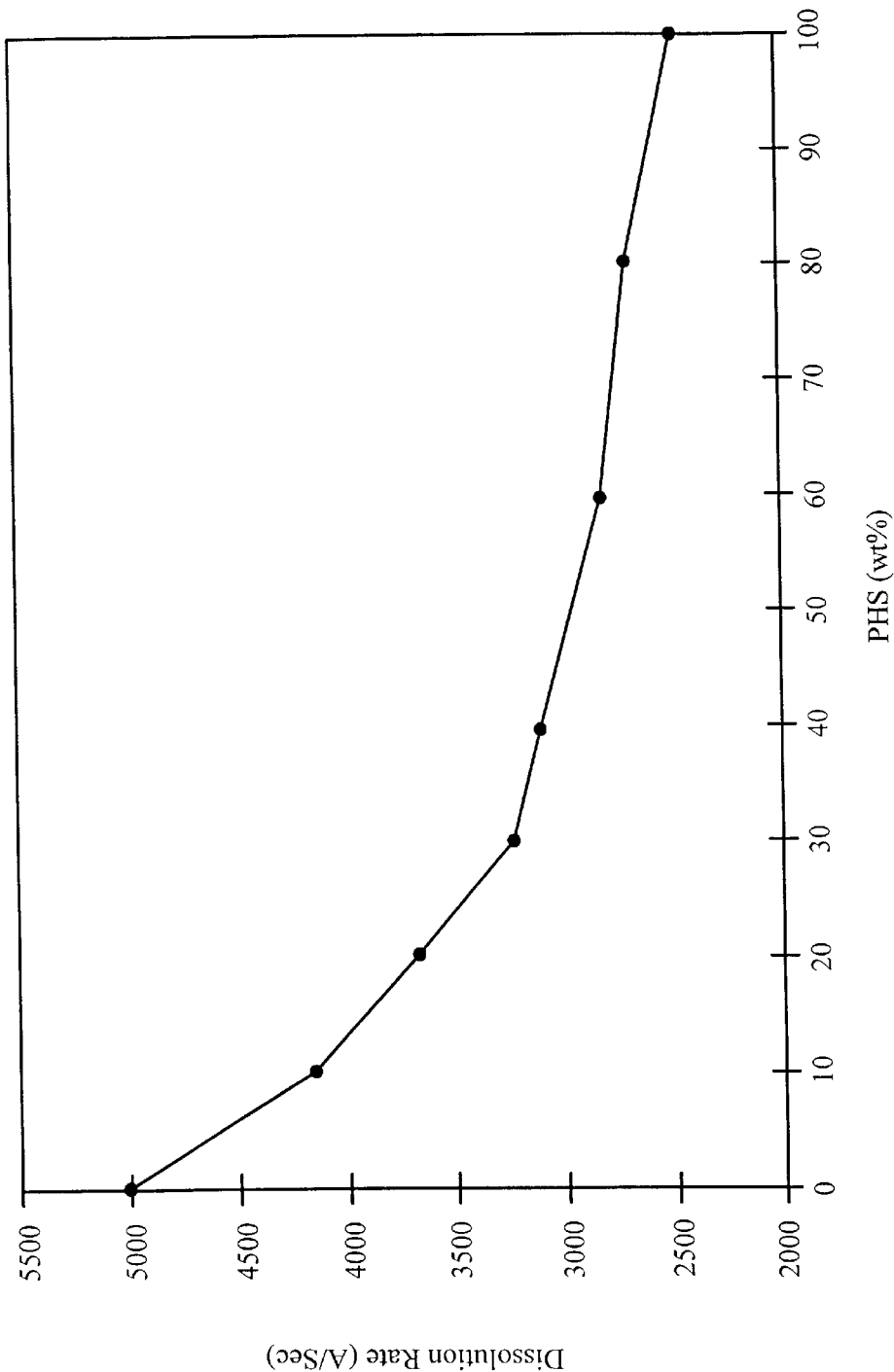
FIG. 2 is a graph showing a decrease in the dissolution rate of a blended polymer resin with increasing content of a non-silicon-containing compound.

In addition to improved thermal characteristics, the blending of the described silsesquioxane polymer and non-silsesquioxane polymer according to the invention preferably results in a modulation of the dissolution properties of the corresponding photoresist compared to a photoresist which is free of non-silsesquioxane polymer. Typically, the modulation is in the form of decreasing the dissolution rate as compared to a photoresist which is free of non-silsesquioxane polymer. For example, a conventional PHBS-based resist may develop (dissolve) too quickly in 0.15 N or greater TMAH, as might also many of the other silsesquioxane polymers mentioned above. The blending modulates this dissolution behavior to produce a photoresist which is compatible with 0.15 N or greater TMAH, particularly 0.26 N. FIG. 2 provides a graph showing how blending of poly(hydroxystyrene) (PHS) with PHB/MBS decreases the dissolution rate. At approximately 30 wt. % PHS, a dissolution rate is reached that is generally compatible with 0.26 N TMAH developer. The particular PHB/MBS polymer used in FIG. 2 contained approximately a 3 to 2 mole ratio of hydroxybenzylsilsesquioxane repeating units to methoxybenzylsilsesquioxane repeating units.

Thus, the polymer blends and the resulting negative photoresist compositions of the invention are preferably suitably soluble (prior to radiation exposure) in aqueous alkaline developers such as 0.14 N TMAH. More preferably, the polymer blends and the resulting photoresist compositions of the invention are suitably soluble in higher normality aqueous alkaline solutions, such as solutions of at least about 0.20 N, most preferably at least about 0.26 N (generally corresponding to the normality of the most commonly used developers in the semiconductor photolithography industry). In addition to solubility, the photoresist composition is preferably capable of achieving high resolution and good image profile with the given developer solution.

Figure 3:
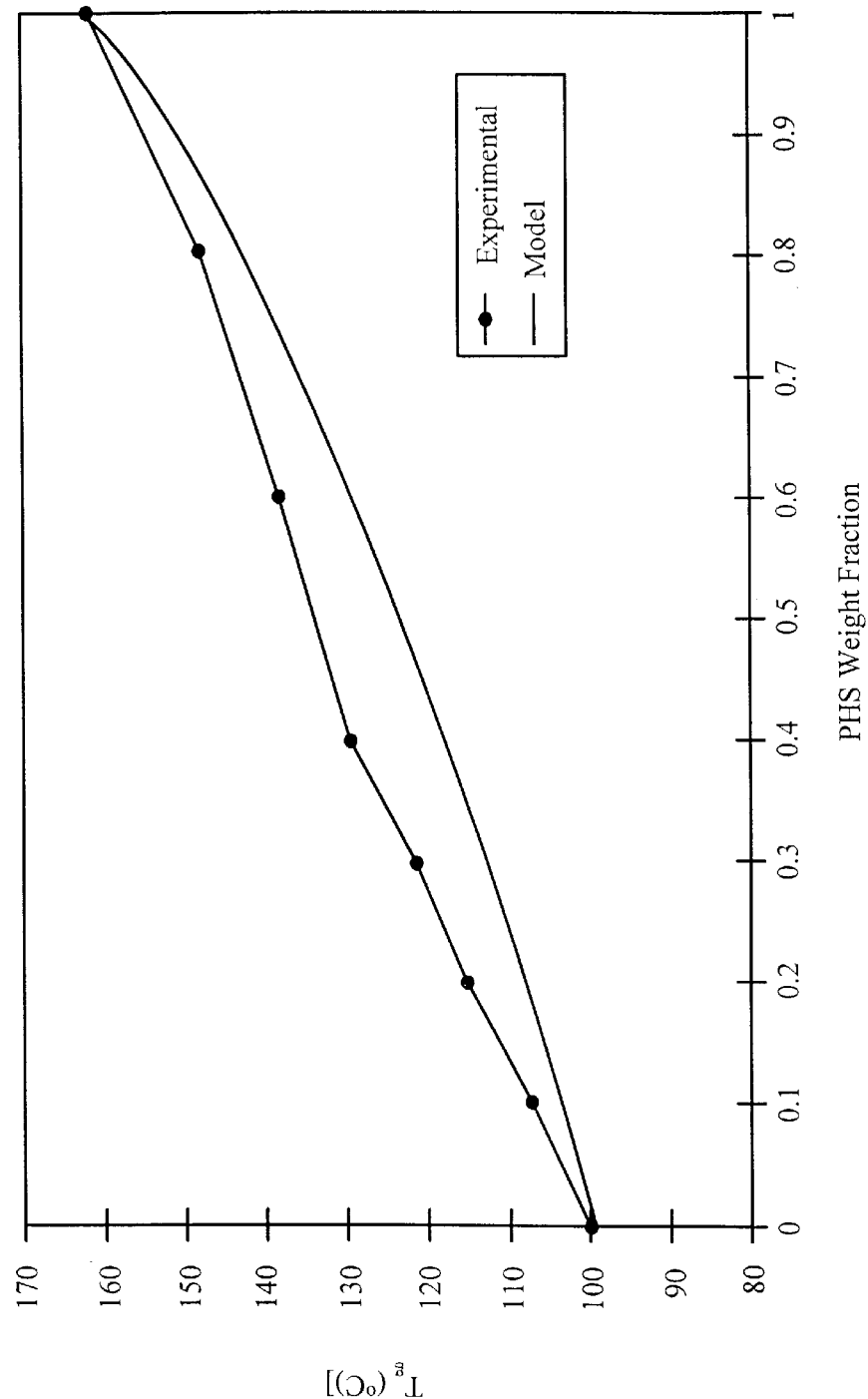
FIG. 3 is graph showing an increase in the glass transition temperature of a blended polymer resin with increasing content of a non-silicon-containing compound.

Advantageously, the $T_g$ benefit and the improved dissolution control benefit can be achieved in the same photoresist composition using a polymer blend of the invention. For example, FIG. 3 provides a graph showing how blending of PHS with PHB/MBS increases $T_g$. At approximately 30 wt. % PHS, a $T_g$ is reached that is suitable for a multilayer imaging photoresist. Notably, as the portion of PHS increases in FIGS. 2 and 3, $T_g$ increases but dissolution rate decreases.

Preferably, the polymer component contains about 30 to 100 wt. % silsesquioxane polymer based on the total weight of the polymer component, more preferably about 60 to 90 wt. % silsesquioxane polymer. Also, the polymer component preferably has a silicon content of at least about 5 wt. %, more preferably at least about 10 wt. %. If the silicon content is below 5 wt. %, the etch resistance benefit associated with the presence of silicon in the photoresist may be compromised. The polymer blend comprises 30–90 wt. % of a silsesquioxane polymer and 70–10 wt. % of a non-silsesquioxane polymer.

In addition to the above-mentioned benefits, the blending of the silsesquioxane polymer and non-silsesquioxane polymer may advantageously increase the number of available cross linking sites in the overall photoresist composition if the non-silsesquioxane polymer contains a larger number of cross linking sites per repeating unit than does the selected silsesquioxane polymer. Such an increase provides a higher cross linking efficiency during exposure of a photoresist containing such blends.

The polymer blends of silsesquioxane polymer and non-silsesquioxane polymer described above may be prepared for use in applications other than photolithography as well. The blend compositions would provide the above mentioned $T_g$ and/or crosslinking benefits in such instances.

The crosslinking agent used in the photoresist compositions of the invention may be any suitable crosslinking agent known in the negative photoresist art which is otherwise compatible with the other selected components of the photoresist composition. The crosslinking agents preferably act to crosslink the polymer component in the presence of a generated acid. Preferred crosslinking agents are glycoluril compounds such as tetramethoxymethyl glycoluril, methylpropyltetramethoxymethyl glycoluril, and methylphenyltetramethoxymethyl glycoluril, available under the POWDER-LINK trademark from American Cyanamid Company. Other possible crosslinking agents include: 2,6-bis (hydroxymethyl)-p-cresol, compounds having the following structures:

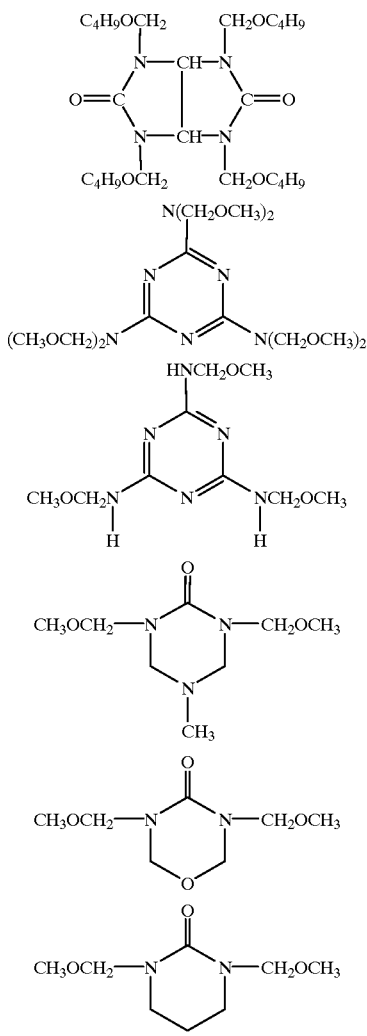

including their analogs and derivatives, such as those found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycolurils, for example as can be found in Canadian Patent No. 1 204 547. Combinations of crosslinking agents may be used.

The photosensitive acid generators used in the photoresist compositions of the invention may be any suitable photosensitive acid generator known in the negative photoresist art which is otherwise compatible with the other selected components of the photoresist composition. Examples of preferred photosensitive acid generators (PAG) include:— (trifluoromethylsulfonyloxy)-bicyclo[2.2.1]hept-5-ene-2,3-dicarboximide ("MDT"), onium salts, aromatic diazonium salts, sulfonium salts, diaryliodonium salts and sulfonic acid esters of N-hydroxyamides or -imides, as disclosed in U.S. Pat. No. 4,731,605. Also, a PAG that produces a weaker acid such as dodecane sulfonate of N-hydroxy-naphthalimide ("DDSN") may be used. Combinations of PAGs may be used.

In addition the above components, the photoresist compositions of the invention generally include a casting solvent to dissolve the other components so that the overall composition may be applied evenly on the substrate surface to provide a defect-free coating. Where the photoresist composition is used in a multilayer imaging process, the solvent used in the imaging layer photoresist is preferably not a solvent to the underlayer materials, otherwise the unwanted intermixing may occur. Examples of suitable casting solvents include: ethoxyethylpropionate ("EEP"), a combination of EEP and γ-butyrolactone ("GBL"), propyleneglycohnonoethylether acetate (PGMEA), and ethyl lactate. The invention is not limited to selection of any particular solvent.

The photoresist compositions may further include an organic base additives, surfactants, sensitizers or other expedients known in the art. The compositions of the invention are not limited to any specific selection of these expedients.

Examples of base additives include: dimethylamino pyridine, 7-diethylamino-4-methyl coumarin ("Coumarin 1"), tertiary amines, proton sponge, berberine, and the polymeric amines as in the PLURONIC or TETRONIC series from BASF. Tetra alkyl ammonium hydroxides or cetyltrimethyl ammonium hydroxide may be used as a base additive when the PAG is an onium salt.

Examples of possible surfactants include fluorine-containing surfactants such as FLUORAD FC-430 available from 3M Company in St. Paul, Minn., and siloxane-containing surfactants such as the SILWET series available from Union Carbide Corporation in Danbury, Conn.

Examples of sensitizers include chrysenes, pyrenes, fluoranthenes, anthrones, benzophenones, thioxanthones, and anthracenes, such as 9-anthracene methanol (9-AM). Additional anthracene derivative sensitizers are disclosed in U.S. Pat. No. 4,371,605. The sensitizer may include oxygen or sulfur. The preferred sensitizers will be nitrogen free, because the presence of nitrogen, e.g., an amine or phenothiazine group, tends to sequester the free acid generated during the exposure process resulting in loss of photosensitivity.

The photoresist compositions of the invention are not limited to any specific proportions of the various components. Where the photoresist compositions of the invention contain a solvent, the compositions preferably contain about 5 to 50 wt. % solids. The amount of PAG is preferably about 1 to 20 wt. % based on the weight of the polymer component. The amount of crosslinking agent is preferably about 1 to 30 wt. % based on the weight of the polymer component, more preferably about 5 to 25 wt. %.

The photoresist compositions of the invention are especially useful as imaging layers in multilayer photolithographic processes, however, the photoresist compositions of the invention may be used in single layer photolithographic processes. Preferably, the photoresist compositions of the invention may be patterned using various radiation types such as mid-UV, deep-UV (specifically 248 nm, 193 nm, and 157 nm wavelengths), extreme-UV (approximately 13 nm wavelength), x-ray, electron beam, and ion beam. The appropriate radiation type(s) may depend on the components of the overall photoresist composition (e.g., the selection of the photosensitive acid generator, sensitizer, polymer component, etc.). The photoresist compositions of the invention generally provide high resolution (approximately 300 nm resolution or less) in combination with desired dissolution behavior. For example, resist compositions using the blended polymer component described above typically provide resolution of 200 nm or less. The PBB/MBS copolymer used to create FIGS. 2 and 3 produced 250 nm resolution when the polymer component included 40 wt. % poly(4-hydroxystyrene) and 230 mn resolution when the polymer component included 30 wt. % poly(4-hydroxystyrene).

Similarly, PHPE/BS polymer with 2 HPES repeating units to 1 t-butylsilsesquioxane repeating unit produced 190 nm resolution when the polymer resin included 30 wt. % poly (4-hydroxystyrene).

The invention provides a multilayer lithography method including the steps of: a) forming a first layer of a planarizing material on a substrate; b) forming a second layer of a photoresist material on the first layer, wherein the second layer includes a photoresist composition of the invention; c) pattern-wise exposing the second layer to radiation using a patterning tool, followed by post-exposure baking; d) developing a pattern in the second layer to remove unexposed portions of the second layer and to form a patterned resist that reveals portions of the first layer; and e) removing revealed portions of the first layer using remaining portions of the second layer as a mask. Preferably, the resist image formed in the second layer is a high resolution resist image. Preferably, the step of developing the second layer uses a TMAH solution of about 0.14 N or greater, more preferably about 0.20 N or greater, most preferably about 0.26 N or greater.

Preferably, the first layer is a highly energy absorbing underlayer. Preferably, the patternwise exposed resist layer is baked between the exposure and developing steps to facilitate crosslinking in the radiation-exposed portions of the photoresist layer. The portions of the first layer are preferably removed in step (e) by etching. Preferably, the etching is performed by $O_2$ plasma reactive ion etching (RIE) or other RIE technique. Once the desired portions of the underlayer have been removed, the pattern may be transferred to portions of the substrate by etching (e.g., by reactive ion etching) the substrate at positions corresponding to the removed portions of the underlayer.

The following examples are provided to further describe the present invention. The invention is not limited to the details of the examples.

EXAMPLE 1

1.1) Synthesis of 4-acetoxyphenylethyl trichlorosilane

Trichlorosilane (56.9 grams, 0.42 mole), 4-acetoxystyrene (64.6 grams, 0.40 mole), and 200 ml heptane were placed in a round bottom flask equipped with a water condenser and nitrogen inlet. Hydrogen hexachloroplatinate(IV) hydrate (20 mg) was added to this solution and heated to reflux for 18 hours. Afterwards, the solution was filtered hot through a frit funnel. The solvent and the unreacted reagents were distilled off at atmospheric pressure and the residue was purified by distillation under reduced pressure. 4-acetoxyphenylethyl trichlorosilane (91.2 grams) was collected between 105–125° C. at 1 mm Hg pressure as a waxy solid.

1.2) Hydrolysis of 4-acetoxyphenylethyl trichlorosilane

4-Acetoxyphenylethyl trichlorosilane (91.0 grams, 0.306 mole) in tetrahydrofiaran (THF, 182 ml) was added drop wise into a cold solution (ice/water bath) of diethylamine (70.5 grams, 0.96 mole) in water (90 ml). The mixture was then heated to reflux for 1 hour. After cooling to room temperature, the organic phase was separated and diluted with 100 ml ether. This solution was washed twice with brine (150 ml) and dried over anhydrous magnesium sulfate. The solvent was then removed in a rotary evaporator and the product was dried under vacuum.

1.3) Synthesis of poly(4-acetoxyphenylethylsilsesquioxane)

The product from step 1.2 was dissolved in toluene (23 grams) and placed in a round bottom flask equipped with a Dean-Stark apparatus (to remove the water produced during condensation reaction) and a water-condenser. To this solution, potassium hydroxide (91 mg) was added and the mixture was heated to reflux for 16 hours. Afterwards, more toluene (100 ml) was added to the mixture and filtered through a frit funnel. The toluene was removed in a rotary evaporator.

1.4) Synthesis of poly(4-hydroxyphenylethylsilsesquioxane)

To the polymer product from step 1.3 was added methanol (200 ml) and ammonium hydroxide (30% solution in water, 20 ml), and the mixture was heated to mild reflux for 2.5 hours. The solution was cooled to room temperature and added drop wise into a mixture of water (4 liter) and acetic acid (40 ml). The precipitated polymer (coagulated) was separated by decantation and dried in a vacuum oven at 60° C. for two hours. This polymer was powdered, transferred into a frit fimnel and washed with water (3×150 ml). Then it was dried in a vacuum oven at 60° C. for 24 hours. Yield: 24 grams. $M_w$=16,000. $T_g$=65° C.

EXAMPLE 2

Synthesis of poly(4-hydroxyphenylethylsilsesquioxane-co-t-butylsilsesquioxane) 2:1

This polymer was synthesized from a 2:1 molar mixture of 4-acetoxyphenylethyltrichlorosilane and t-butyltrichlorosilane following the procedure of steps 1.3 and 1.4 of Example 1. The resulting polymer had $M_w$=5,000 and $T_g$=90° C.

EXAMPLE 3

Synthesis of poly(4-hydroxyphenylethylsilsesquioxane-co-t-butylsilsesquioxane) 3:1

This polymer was synthesized from a 3:1 molar mixture of 4-acetoxyphenylethyltrichlorosilane and t-butyltrichlorosilane following the procedure of steps 1.3 and 1.4 of Example 1. The resulting polymer had $M_w$=16,000 and $T_g$=81° C.

EXAMPLE 4

Synthesis of poly(4-hydroxyphenylethylsilsesquioxane-co-cyclohexylsilsesquioxane) 2:1

This polymer was synthesized from a 2:1 molar mixture of 4-acetoxyphenylethyltrichlorosilane and cyclohexyltrichlorosilane following the procedure of steps 1.3 and 1.4 of Example 1. The resulting polymer had $M_w$=6,700 and $T_g$=89° C.

EXAMPLE 5

Synthesis of poly(4-hydroxy-α-methylbenzylsilsesquioxane)

Trichlorosilane (100 g, 0.74 mole) and 4-acetoxystyrene (120.5 g, 0.74 mole) were placed in a round bottom flask equipped with a water condenser and a nitrogen inlet. Di-$\mu$-carbonyldi-$\pi$-cyclopentadienyldinickel (210 g) was added to this solution and stirred at room temperature for 18 hours. At this point, it was determined that no reaction had taken place as determined by proton NMR. The reaction mixture was then warmed up with a heating mantle. An exothermic reaction started. The heating mantle was removed and the mixture was stirred for three hours. The mixture was then distilled under reduced pressure. 4-acetoxy-α-methylbenzyltrichlorosilane (128 g) was collected between 98–114° C. at 1 mm pressure. The alkyl moiety of the alkoxyphenylalkyl trihalosilane produced was a branched alkyl moiety as opposed to the straight chain produced above in Example 1.

The 4-acetoxy-α-methylbenzyltrichlorosilane was then used to synthesize the poly(4-hydroxy-α-methylbenzylsilsesquioxane) polymer following the procedure of steps 1.3 and 1.4 of Example 1. The resulting polymer had $M_w$=1500 and $T_g$=91° C.

EXAMPLE 6
Poly(4-hydroxyphenylethylsilsesquioxane) (PHPES) and poly(4-hydroxystyrene) (PHS) blend (60% (w/w) PHS polymer resin blend)

A silicon-containing resist was formulated with 3.42 wt. % PHPES, 5.12 wt. % PHS, 1.24 wt. % tetramethoxymethyl glycoluril (POWDERLINK), 0.52 wt. % di(t-butylphenyl) iodonium camphorsulfonate, 103 ppm by weight coumarin-1, 569 ppm by weight surfactant (FLUORAD FC-430), and 89.64 wt. % propylene-glycolmonomethylether acetate (PGMEA) solvent. The resulting photoresist formulation was filtered through a 0.2 μm filter. The photoresist was then spin coated onto a 0.8 micrometer (μm) hard baked (230° C. for 2 minutes) I-line resist underlayer on a silicon wafer to obtain an about 0.2 μm thick top imaging layer. The resist film was given a pre-exposure bake at 110° C. for 60 seconds, followed by patternwise exposure to 248 nm deep ultra-violet (DUV) light on a Nikon (0.6 NA) DUV stepper and post-exposure bake at 110° C for 60 seconds. This was followed by a two 30 second puddle development steps using a 0.14 N TMAH developer to resolve 0.35 μm line and space features.

EXAMPLE 7
Poly(4-hydroxyphenylethylsilsesquioxane-co-t-butylsilsesquioxane) 2:1 (HPE/BS 2:1) and PHS blend (30% (w/w) PHS polymer resin blend)

A silicon-containing resist was formulated with 5.98 wt. % PHPE/BS 2:1, 2.56 wt. % PHS, 1.24 wt. % tetramethoxymethyl glycoluril (POWDERLINK), 0.51 wt. % di(t-butylphenyl) iodonium camphorsulfonate, 103 ppm by weight coumarin-1, 569 ppm by weight surfactant (FLUORAD FC-430), and 89.63 wt. % PGMEA solvent. The resulting photoresist formulation was filtered through a 0.2 μm filter. The photoresist was then spin coated onto a 0.8 μm hard baked (230° C. for 2 minutes) I-line resist underlayer on a silicon wafer to obtain an about 0.2 μm thick top imaging layer. The resist film was pre-exposure baked at 110° C. for 60 seconds, patternwise exposed to 248 nm DUV light on a Nikon (0.6 NA) DUV stepper, and post-exposure baked at 110° C. for 60 seconds. This was followed by two 30 second each puddle development steps with a 0.26 N TMAH developer to resolve 0.19 μm line and space features.

EXAMPLE 8
PHPE/BS 2:1 and PHS blend (40% (w/w) PHS polymer resin blend)

A silicon-containing resist was formulated with 5.12 wt. % PHPE/BS 2:1, 3.42 wt. % PHS, 1.24 wt. % tetramethoxymethyl glycoluril (POWDERLINK), 0.52 wt. % di(t-butylphenyl) iodonium camphorsulfonate, 103 ppm by weight coumarin-1, 569 ppm by weight surfactant (FLUORAD FC-430), and 89.64 wt. % PGMEA solvent. The resulting photoresist formulation was filtered through a 0.2 μm filter. The photoresist formulation was then spin coated onto a 0.8 μm hard baked (230° C. for 2 minutes) I-line resist underlayer on a silicon wafer to obtain an about 0.2 μm thick top imaging layer. The resist fiIn was pre-exposure baked at 110° C. for 60 seconds, patternwise exposed to 248 nm DUV light on a Nikon (0.6 NA) DUV stepper, and post-exposure baked at 110° C. for 60 seconds. This was followed by two 30 second each puddle development steps with a 0.26 N TMAH developer to resolve 0.19 μm line and space features.

EXAMPLE 9
Poly(4-hydroxybenzylsilsesquioxane-co-4-methoxybenzylsilsesquioxane) 3:2 (PHB/MBS 3:2) and PHS blend (30% (w/w) PHS polymer resin blend)

A silicon-containing resist was formulated with 36.96 wt. % (based on the total weight of the formulation) of a solution containing 15 wt. % (based on the weight of the solution) PHB/MBS 3:2 and 85 wt. % (based on the weight of the solution) PGMEA, 2.38 wt. % poly(4-hydroxystyrene) (PHS), 1.85 wt. % tetramethoxymethyl glycoluril (POWDERLINK), 0.52 wt. % di(t-butylphenyl) iodonium camphorsulfonate, 103 ppm by weight coumarin-1, 528 ppm by weight surfactant (FLUORAD FC-430), and 58.23 wt. % additional PGMEA solvent. The resultant photoresist formulation was filtered through a 0.2 μm filter. The photoresist was then spin coated on a 0.8 μm hard baked (230° C. for 2 minutes) I-line resist underlayer on a silicon wafer to obtain an about 0.2 μm thick top imaging layer. The resist film was pre-exposure baked at 110° for 60 seconds, patternwise exposed to 248 nm DV light on a Nikon (0.6 NA) DUV stepper, and post-exposure baked at 110° C. for 60 seconds. This was followed by two 30 second each puddle development steps with a 0.26 N TMAH developer to resolve 0.23 μm line and space features.

EXAMPLE 10
Poly(4-hydroxy-α-methylbenzylsilsesquioxane) (PHMBS)

A silicon-containing resist was formulated with 7.77 wt. % PHMBS, 1.85 wt. % tetramethoxymethyl glycoluril (POWDERLINK), 0.67 wt. % di(t-butylphenyl) iodonium perfluorooctanesulfonate, 103 ppm by weight coumarin-1, 518 ppm by weight surfactant (FLUORAD FC-430), and 89.64 wt. % PGMEA solvent. The resultant photoresist formulation was filtered through a 0.2 μm filter. The photoresist was then spin coated onto a 0.7 μm hard baked (230° C. for 4 minutes) DUV anti-reflective coating (polysulfone) on a silicon wafer to obtain an about 0.2 μm thick top imaging layer. The resist film was pre-exposure baked at 110° C. for 60 seconds, patternwise exposed to 248 nm DUV light on an ASM (0.6 NA) DUV stepper, and post-exposure baked at 110° C. for 60 seconds. This was followed by a two 30 second each puddle development steps with an 0.14 N TMAH developer to resolve 0.2 μm features.

While the invention has been particularly shown and described with reference to preferred embodiments thereof, it will be understood by those skilled in the art that various changes in form and details may be made therein without departing from the spirit and scope of the invention.

What is claimed is:

1. A polymer blend comprising:
   30 to 90 wt. % of a silsesquioxane polymer, wherein the silsesquioxane polymer includes a repeating unit having an $R_1$ group and a repeating unit having an $R_2$ group as described by the formula:

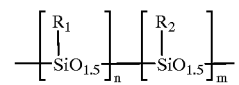

wherein $R_1$ is hydroxyphenylalkyl having at least 2 carbon atoms in its alkyl moiety and n is greater than zero, and wherein $R_2$ is selected from the group consisting of alkyl, cycloalkyl, and aryl moieties, and wherein m is greater than zero; and 70–10 wt. % of a non-silsesquioxane polymer.

2. The polymer blend of claim 1, wherein each occurrence of $R_2$ is independently selected from the group consisting of alkoxyphenylalkyl having independently at least 1 carbon atom each in its alkyl moiety and alkoxy moiety, alkyl acid alkylphenyl ester or alkoxy methanoic acid alkylphenyl ester having independently at least 1 carbon atom in each alkyl moiety, t-butyl, cyclohexyl, phenyl, and bicycloheptyl.

3. The polymer blend of claim 1, wherein n and m are selected such that n/(n+m) equals about 0.05 to 1.0.

4. The polymer blend of claim 1, wherein the silsesquioxane polymer has a weight average molecular weight of about 800 to 500,000.

5. The polymer blend of claim 1, wherein $R_1$ and $R_2$ are selected to provide a compound selected from the group consisting of:

poly(p-hydroxyphenylethylsilsesquioxane-co-p-hydroxy-α-methylbenzylsilsesquioxane),
poly(p-hydroxyphenylethylsilsesquioxane-co-methoxybenzylsilsesquioxane),
poly(p-hydroxyphenylethylsilsesquioxane-co-t-butylsilsesquioxane),
poly(p-hydroxyphenylethylsilsesquioxane-co-cyclohexylsilsesquioxane),
poly(p-hydroxyphenylethylsilsesquioxane-co-phenylsilsesquioxane),
poly(p-hydroxyphenylethylsilsesquioxane-co-bicycloheptylsilsesquioxane),
poly(p-hydroxy-α-methylbenzylsilsesquioxane-co-p-hydroxybenzylsilsesquioxane),
poly(p-hydroxy-α-methylbenzylsilsesquioxane-co-methoxybenzylsilsesquioxane),
poly(p-hydroxy-α-methylbenzylsilsesquioxane-co-t-butylsilsesquioxane),
poly(p-hydroxy-α-methylbenzylsilsesquioxane-co-cyclohexylsilsesquioxane),
poly(p-hydroxy-α-methylbenzylsilsesquioxane-co-phenylsilsesquioxane),
poly(p-hydroxy-α-methylbenzylsilsesquioxane-co-bicycloheptylsilsesquioxane), and
poly(p-hydroxybenzylsitsesquioxane-co-p-hydroxyphenylethylsilsesquioxane).

6. The polymer blend of claim 1, wherein said silsesquioxane has a glass transition temperature between 30 and 400° C.

7. The polymer blend of claim 1, wherein the non-silsesquioxane polymer comprises a repeating unit having an $R_9$ and $R_{11}$ group and a repeating unit having an $R_{10}$ and $R_{12}$ group as described by the formula:

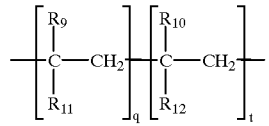

wherein:
a) each occurrence of $R_9$ or $R_{10}$ is independently selected from the group consisting of H, alkyl, and halogen;
b) each occurrence of $R_{11}$ is independently selected from the group consisting of hydroxyphenyl and its derivatives and cycloalkyl with a cross-linkable functionality;
c) each occurrence of $R_{12}$ is independently selected from the group consisting of phenyl, hydroxyphenyl, cycloalkyl, hydroxycyclohexyl, and —COO—R13—OH, wherein $R_{13}$ is alkyl, cycloalkyl, or aryl, but $R_{10}$ is not halogen when $R_{12}$ is —COO—R13—OH; and
d) each occurrence of q and t are greater than zero.

8. The polymer blend of claim 7, wherein n and m of the silsesquioxane polymer are selected such that n/(n+m) equals about 0.05 to 1.0 and q and t of the non-silsesquioxane polymer are selected such that q/(q+t) equals about 0.4 to 1.0.

9. A negative photoresist composition, said photoresist composition comprising (a) a polymer component, (b) an acid-sensitive crosslinking agent, and (c) a photosensitive acid generator, said polymer component comprising 30 to 90 wt. % of a silsesquioxane polymer comprising a repeating unit having an $R_1$ group and a repeating unit having an $R_2$ group as described by the formula:

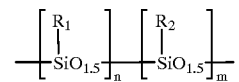

wherein $R_1$ is hydroxyphenylalkyl having at least 2 carbon atoms in its alkyl moiety and n is greater than zero, and wherein $R_2$ is selected from the group consisting of alkyl, cycloalkyl, and aryl moieties, and wherein m is greater than zero; and 70–10 wt. % of a non-silsesquioxane polymer.

10. The photoresist composition of claim 9 wherein each occurrence of $R_2$ is independently selected from the group consisting of: alkoxyphenylalkyl having independently at least 1 carbon atom each in its alkyl moiety and alkoxy moiety, alkyl acid alkylphenyl ester or alkoxy methanoic acid alkylphenyl ester having independently at least 1 carbon atom in each alkyl moiety, t-butyl, cyclohexyl, phenyl, and bicycloheptyl.

11. The photoresist composition of claim 10, wherein n and m are selected such that n/(n+m) equals about 0.05 to 1.0.

12. The photoresist composition of claim 10 wherein said silsesquioxane polymer is selected from the group consisting of:

poly(p-hydroxyphenylethylsilsesquioxane-co-p-hydroxy-α-methylbenzylsilsesquiioxane),
poly(p-hydroxyphenylethylsilsesquioxane-co-methoxybenzylsilsesquioxane),
poly(p-hydroxyphenylethylsilsesquioxane-co-t-butylsilsesquioxane),
poly(p-hydroxyphenylethylsilsesquioxane-co-cyclohexylsilsesquioxane),
poly(p-hydroxyphenylethylsilsesquioxane-co-phenylsilsesquioxane),
poly(p-hydroxyphenylethylsilsesquioxane-co-bicycloheptylsilsesquioxane),
poly(p-hydroxy-α-methylbenzylsilsesquioxane-co-p-hydroxybenzylsilsesquioxane),
poly(p-hydroxy-α-methylbenzylsilsesquioxane-co-methoxybenzylsilsesquioxane),
poly(p-hydroxy-α-methylbenzylsilsesquioxane-co-t-butylsilsesquioxane),
poly(p-hydroxy-α-methylbenzylsilsesquioxane-co-cyclohexylsilsesquioxane),
poly(p-hydroxy-α-methylbenzylsilsesquioxane-co-phenylsilsesquioxane),
poly(p-hydroxy-α-methylbenzylsilsesquioxane-co-bicycloheptylsilsesquioxane), and
poly(p-hydroxybenzylsilsesquioxane-co-p-hydroxyphenylethylsilsesquioxane).

13. The photoresist composition of claim 9 wherein said silsesquioxane polymer has a weight average molecular weight of about 800 to 500,000.

14. The photoresist composition of claim 9, wherein said silsesquioxane polymer has a glass transition temperature preferably between 30 and 400° C.

15. A negative photoresist composition, said photoresist composition comprising (a) a polymer component, (b) an acid-sensitive crosslinking agent, and (c) a photosensitive acid generator, said polymer component comprising a blend of about 30–90 wt. % silsesquioxane polymer and about 70–10 wt. % non-silsesquioxane polymer, said percentages being based on the total weight of said polymer component.

16. The photoresist composition of claim 15 wherein said silsesquioxane polymer comprises a repeating unit having an $R_1$ group and a repeating unit having an $R_2$ group as described by the formula:

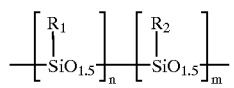

wherein $R_1$ is hydroxyphenylalkyl having at least 1 carbon atom in its alkyl moiety and n is greater than zero and wherein $R_2$ is selected from the croup consisting of alkyl, cycloalkyl, and aryl moieties, and wherein m is greater than zero.

17. The photoresist composition of claim 16 wherein each occurrence of $R_2$ is independently selected from the group consisting of: alkoxyphenylalkyl having independently at least 1 carbon atom each in its alkyl moiety and alkoxy moiety, alkyl acid alkylphenyl ester or alkoxy methanoic acid alkylphenyl ester having independently at least 1 carbon atom in each alkyl moiety, t-butyl, cyclohexyl, phenyl, and bicyclobeptyl.

18. The photoresist composition of claim 16, wherein n and m are selected such that n/(n+m) equals about 0.05 to 1.0.

19. The photoresist composition of claim 16 wherein said silsesquioxane polymer is selected from the group consisting of:
poly(p-hydroxyphenylethylsilsesquioxane-co-p-hydroxy-α-methylbenzylsilsesquioxane),
poly(p-hydroxyphenylethylsilsesquioxane-co-methoxybenzylsilsesquioxane),
poly(p-hydroxyphenylethylsilsesquioxane-co-t-butylsilsesquioxane),
poly(p-hydroxyphenylethylsilsesquioxane-co-cyclohexylsilsesquioxane),
poly(p-hydroxyphenylethylsilsesquioxane-co-phenylsilsesquioxane),
poly(p-hydroxyphenylethylsilsesquioxane-co-bicycloheptylsilsesquioxane),
poly(p-hydroxy-α-methylbenzylsilsesquioxane-co-p-hydroxybenzylsilsesquioxane),
poly(p-hydroxy-α-methylbenzylsilsesquioxane-co-methoxybenzylsilsesquioxane),
poly(p-hydroxy-α-methylbenzylsilsesquioxane-co-t-butylsilsesquioxane),
poly(p-hydroxy-α-methylbenzylsilsesquioxane-co-cyclohexylsilsesquioxane),
poly(p-hydroxy-α-methylbenzylsilsesquioxane-co-phenylsilsesquioxane),
poly(p-hydroxy-α-methylbenzylsilsesquioxane-co-bicycloheptylsilsesquioxane),
poly(p-hydroxybenzylsilsesquioxane-co-p-hydroxyphenylethylsilsesquioxane), poly(p-hydroxybenzylsilsesquioxane), poly(p-hydroxybenzylsilsesquioxane-co-methoxybenzylsilsesquioxane), poly(p-hydroxybenzylsilsesquioxane-co-t-butylsilsesquioxane), poly(p-hydroxybenzylsilsesquioxane-co-cyclohexylsilsesquioxane),
poly(p-hydroxybenzylsilsesquioxane-co-phenylsilsesquioxane), and poly(p-hydroxybenzylsilsesquioxane-co-bicycloheptylsilsesquioxane).

20. The photoresist composition of claim 15 wherein said silsesquioxane polymer has a weight average molecular weight of about 800 to 500,000.

21. The photoresist composition of claim 15, wherein said silsesquioxane polymer has a glass transition temperature between 30 and 400° C.

22. The photoresist composition of claim 15 wherein said non-silsesquioxane polymer is selected from the group consisting of poly(hydroxystyrene); poly(cyclo-olefins); and copolymers, terpolymers, or multifunctional polymers of (a) hydroxystyrene or cyclo-olefin and (b) monomers selected from the group consisting of styrene, vinylcyclohexanol, acrylic acid hydroxyalkyl ester, and their derivatives.

23. The photoresist composition of claim 15 additionally comprising a solvent.

24. The composition of claim 15, wherein the non-silsesquioxane polymer comprises a repeating unit having an $R_9$ and $R_{11}$ group and a repeating unit having an $R_{10}$ and $R_{12}$ group as described by the formula:

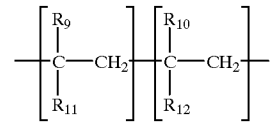

wherein:
a) each occurrence of $R_9$ or $R_{10}$ is independently selected from the group consisting of H, alkyl, and halogen;
b) each occurrence of $R_{11}$ is independently selected from the group consisting of hydroxyphenyl and its derivatives or cycloalkyl with a cross-linkable functionality; and
c) each occurrence of $R_{12}$ is independently selected from the group consisting of phenyl, hydroxyphenyl, cycloalkyl, hydroxycyclohexyl, and —COO—$R_{13}$—OH, wherein $R_{13}$ is alkyl, cycloalkyl, or aryl, but $R_{10}$ is not halogen when $R_{12}$ is —COO—$R_{13}$—OH.

25. The composition of claim 24, wherein $R_9$, $R_{10}$, $R_{11}$, and $R_{12}$ are selected to provide a compound selected from the group consisting of poly(4-hydroxystyrene), poly(4-hydroxystyrene-co-styrene), poly(4-hydroxystyrene-co-4-vinylcyclohexanol), poly(4-hydroxystyrene-co-acrylic acid hydroxymethyl ester), and poly(4-hydroxystyrene-co-acrylic acid hydroxyethyl ester).

26. The photoresist composition of claim 15, further comprising at least one component selected from the group consisting of base additives, surfactants, and sensitizers.

27. The composition of claim 15, wherein the polymer component contains 60 to 90 wt. % silsesquioxane polymer.

28. The composition of claim 15, wherein the non-silsesquioxane polymer is substantially miscible with the silsesquioxane polymer and said photoresist is developable with 0.14 normal (N) or greater tetramethylammoniumhydroxide (TMAH).

29. The composition of claim 28, wherein said photoresist is developable with about 0.26 N aqueous TMAH solution.

30. The composition of claim 15, wherein the silicon content of the polymer component is at least about 5% by weight.

31. The composition of claim 30, wherein the silicon content of the polymer component is at least about 10% by weight.

32. A polymer blend comprising a silsesquioxane polymer preferably having a weight average molecular weight of about 800 to 500,000 and a non-silsesquioxane polymer having a weight average molecular weight of about 1,000 to 100,000.

33. The polymer blend of claim 32, comprising:

the silsesquioxane polymer which includes a repeating unit having an $R_1$ group and a repeating unit having an $R_2$ group as described by the formula:

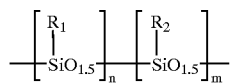

wherein $R_1$ is hydroxyphenylalkyl having at least 2 carbon atoms in its alkyl moiety and n is greater than zero and wherein $R_2$ is preferably selected from the group consisting of alkyl, cycloalkyl, and aryl moieties, and m is greater than zero; and a non-silsesquioxane polymer including a repeating unit having an $R_9$ and $R_{11}$ group and a repeating unit having an $R_{10}$ and $R_{12}$ group as described by the formula:

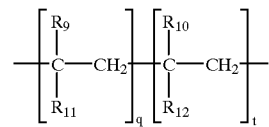

wherein:

a) each occurrence of $R_9$ or $R_{10}$ is independently selected from the group consisting of H, alkyl, and halogen;

b) each occurrence of $R_{11}$ is independently selected from the group consisting of hydroxyphenyl and its derivatives and cycloalkyl with a cross-linkable functionality;

c) each occurrence of $R_{12}$ is independently selected from the group consisting of phenyl, hydroxyphenyl, cycloalkyl, hydroxycyclohexyl, and —COO—$R_{13}$—OH, wherein $R_{13}$ is alkyl, cycloalkyl, or aryl, but $R_{10}$ is not halogen when $R_{12}$ is —COO—$R_{13}$—OH; and d) each occurrence of q and t are greater than zero.

34. The polymer blend of claim 33, wherein n and m of the silsesquioxane polymer are selected such that n/(n+m) equals about 0.05 to 1.0 and q and t of the non-silsesquioxane polymer are selected such that q/(q+t) equals about 0.4 to 1.0.

* * * * *